(12) United States Patent
Wiese

(10) Patent No.: US 11,781,853 B2
(45) Date of Patent: Oct. 10, 2023

(54) MEASUREMENT DEVICE AND METHOD FOR MEASURING AN ADVANCEMENT OF A CABLE

(71) Applicant: iPEK International GmbH, Sulzberg (DE)

(72) Inventor: Johannes Wiese, Immenstadt-Eckarts (DE)

(73) Assignee: IPEK INTERNATIONAL GMBH, Sulzberg (DE)

( * ) Notice: Subject to any disclaimer, the term of this patent is extended or adjusted under 35 U.S.C. 154(b) by 24 days.

(21) Appl. No.: 17/506,398

(22) Filed: Oct. 20, 2021

(65) Prior Publication Data

US 2022/0120552 A1 Apr. 21, 2022

(30) Foreign Application Priority Data

Oct. 20, 2020 (EP) .................................... 20202893

(51) Int. Cl.
  *G01B 7/02* (2006.01)
  *G01R 33/02* (2006.01)
(52) U.S. Cl.
  CPC ............. *G01B 7/026* (2013.01); *G01R 33/02* (2013.01)
(58) Field of Classification Search
  None
  See application file for complete search history.

(56) References Cited

U.S. PATENT DOCUMENTS

| | | | | |
|---|---|---|---|---|
| 2,761,986 A | * | 9/1956 | Wald | G01B 7/046 33/736 |
| 4,570,348 A | * | 2/1986 | Amsler | G01B 7/046 33/734 |
| 6,543,152 B1 | * | 4/2003 | Steinich | B65H 75/4442 33/DIG. 1 |
| 10,527,402 B1 | | 1/2020 | Olsson et al. | |
| 2009/0313844 A1 | | 12/2009 | Swanson et al. | |

FOREIGN PATENT DOCUMENTS

| | | |
|---|---|---|
| DE | 19724387 A1 | 12/1998 |
| FR | 2 409 117 A2 | 6/1979 |

OTHER PUBLICATIONS

Communication under Article 94(3) issued by the European Patent Office for European Patent Application No. 20202893.2-1001, dated Dec. 7, 2022, with machine-generated English translation.
European Search Report with English machine translation issued for corresponding European Application No. 20202893.2 dated Mar. 19, 2021.

* cited by examiner

*Primary Examiner* — Douglas X Rodriguez
(74) *Attorney, Agent, or Firm* — MYERS WOLIN, LLC

(57) ABSTRACT

A measuring device is provided for measuring an advancement of a cable of a sewer cleaning and/or sewer inspection system. A rotatably mounted magnet is designed such that the advancement of the cable can cause rotations of the at least one rotatably mounted magnet, wherein the magnet follows a movement of the cable in the radial direction during advancement of the cable. A corresponding method is also provided.

11 Claims, 9 Drawing Sheets

MEASUREMENT DEVICE AND METHOD FOR MEASURING AN ADVANCEMENT OF A CABLE

CROSS REFERENCE TO RELATED APPLICATIONS

This application claims priority to European Patent Application No. 20 202 893.2 filed Oct. 20, 2020, the contents of which are incorporated by reference herein.

TECHNICAL FIELD

The invention relates to a measuring device for measuring an advancement of a cable of a sewer inspection and/or maintenance system, and to a method for measuring an advancement of a cable of a sewer inspection and/or maintenance system.

BACKGROUND

Sewer inspection and/or maintenance systems are introduced into a sewer and advanced or moved in the sewer in order to inspect or to maintain or repair the sewer. Sewer inspection and/or maintenance systems of this kind usually have cables or push rods by means of which sensors and/or image recording devices can be advanced in the sewer.

Usually, the cable or the push rod is pushed into the sewer or advanced in the sewer by means of a propulsion device. The propulsion device may be a driven wheel or a driven belt. The cable touches the driven wheel or belt and is advanced due to the static friction between the surface of the cable and the wheel or belt. A propulsion device of this kind may be arranged, for example, on a trolley that is moved in the sewer in order to advance or retract a cable or a push rod relative to the trolley. However, a propulsion device of this kind may also be arranged on a cable drum, which is usually located outside the sewer shaft, in order to unwind the cable or the push rod from the cable drum or to wind same onto the cable drum.

Ideally, the cable or the push rod is conveyed by the propulsion device without any errors or wear. However, this ideal case rarely occurs in practice.

In practice, difficulties in conveying the cable or the push rod through the propulsion device may for example include the following:

The diameter of the cable/push rod changes over its length, for example due to crushing.

Cables/push rods of different diameters are to be conveyed.

The cable/push rod is to be conveyed in such a way that the cable/push rod is not damaged. In particular, it is intended to ensure that the cable/push rod is conveyed with as little wear as possible.

While the cable/push rod is being conveyed, the frictional or adhesive properties of the cable/push rod can change constantly. The frictional or adhesive properties depend, in particular, on external environmental influences, such as soiling. The frictional or adhesive properties may for example also depend on the rigidity and/or on the outer material of the cable/push rod.

In practice, the difficulties mentioned usually have the following disadvantages:

Slippage occurs between the cable/push rod and the propulsion device, and therefore the cable/push rod is no longer conveyed or is not conveyed as desired.

The slippage can lead to wear of the cable/push rod and/or wear of the propulsion device, in particular the wheels or belts.

Said slippage arises when the static friction between the propulsion device and the cable/push rod required for the effective advancement of the cable/push rod is not achieved, and therefore the wheel or belt rotates without further conveying the cable/push rod. This results in the further disadvantage that the actual advancement (i.e. the length conveyed in one and/or the other direction) of the cable/push rod can no longer be correctly determined. As such, the exact position of, for example, the head of a push rod in the sewer can no longer be determined under certain circumstances, which can mean that the exact position of damaged areas in the sewer can no longer be determined either.

Another disadvantage of the slippage is that the sliding friction that occurs between the propulsion device and the cable/push rod leads to an undesired generation of heat. As a result, firstly, the cable/push rod, in particular the outer layer of the cable/push rod, can heat up, and therefore breaks have to be taken in order to cool the cable/push rod down again. A heated cable/push rod can also be subject to greater wear than an unheated cable/push rod. Secondly, the propulsion device, i.e. the wheel or the belt, can also heat up considerably as a result, which can lead to considerable and rapid wear of the propulsion device.

The problem of heating also has a particularly negative effect when, for example, a trolley of a sewer inspection and/or maintenance system is to be used in an explosive environment, and the propulsion device is arranged on the trolley. The risk of explosion is then significantly increased.

SUMMARY

An object of the present invention is therefore to provide solutions which at least partially avoid the disadvantages known from the prior art and by means of which the length of a cable/push rod actually conveyed can be determined more reliably.

According to the invention, this object is achieved by a device and a method according to the independent claims. Advantageous embodiments and developments of the invention are specified in the respective dependent claims.

Accordingly, a measuring device is provided for measuring an advancement of a cable of a sewer cleaning and/or sewer inspection system, comprising
 a compensation device, comprising
  at least one magnet mounted so as to be rotatable about an axis of rotation, and
  a magnet holder for receiving the at least one rotatably mounted magnet, and
 a magnetic field sensor,
wherein
 the cable can be guided past the compensation device while the cable is being advanced,
 the at least one rotatably mounted magnet is arranged on the magnet holder in such a way that the advancement of the cable can cause rotations of the at least one rotatably mounted magnet about the axis of rotation, wherein the magnet holder of the compensation device is adapted to follow a movement of the cable in the radial direction during advancement, and
 the magnetic field sensor is arranged at a distance from the at least one rotatably mounted magnet and is adapted to detect the rotations of the at least one rotatably mounted magnet, wherein the detected rotations are a measure of the advancement of the cable.

The magnet holder of the compensation device is adapted to follow a movement of the cable in the radial direction during advancement in order to ensure that the rotation of the magnet is produced even in the event of a radial movement of the cable during advancement. A movement of the cable in the radial direction can occur, for example, when the cable moves away from the compensation device, past which the cable is guided during advancement.

The compensation device may comprise an actuator, in particular a spring element, which acts on the magnet holder, wherein the actuator is designed to cause a pivoting of the magnet holder about a pivot axis or
a linear displacement of the magnet holder,
as a result of which the magnet holder follows the radial movement of the cable.

The magnet holder may comprise a pivot arm, and the at least one rotatably mounted magnet may preferably be arranged at a free end of the pivot arm. Within the context of the invention, "at a free end" means that the magnet may be arranged in the region of the free end or in the vicinity of the free end.

It is advantageous if the actuator is arranged relative to the magnet holder in such a way that the application of an actuating force to the magnet holder by the actuator presses the at least one magnet rotatably mounted on the magnet holder onto the cable that is being guided past. In one embodiment of the invention, the actuator may be arranged in or on the pivot axis.

The at least one rotatably mounted magnet may be arranged in a housing, wherein the housing preferably has a rotationally symmetrical shape, in particular a cylindrical shape.

In one embodiment of the invention, the housing may have a rough surface. Depending on the material of the cable sheath, the static friction between the housing and the cable surface can be improved.

In one embodiment of the invention, the pivot axis may form the axis of rotation of the at least one rotatably mounted magnet.

In one embodiment of the invention, the measuring device may comprise a rotatably mounted element which is arranged on the magnet holder in such a way that rotations of the rotatably mounted element can be caused by the advancement of the cable, wherein the rotatably mounted element can be coupled to the at least one rotatably mounted magnet, and
the rotations of the rotatably mounted element can be transmitted to the at least one rotatably mounted magnet by means of the coupling with the at least one rotatably mounted magnet in order to rotate the at least one rotatably mounted magnet.

It can be advantageous here if the rotatably mounted element is arranged at the free end of the magnet holder and the rotatably mounted magnet is arranged on the pivot axis of the magnet holder.

The magnetic field sensor may be arranged in a space having a negative pressure or a positive pressure.

Furthermore, a system comprising two measuring devices according to the invention is provided, wherein the two measuring devices are arranged on different sides of the cable, preferably on two opposing sides of the cable, and are each adapted to determine a measured value for an advancement of the cable in relation to the relevant measuring device, wherein the advancement of the cable in relation to the system is derived from the determined measured values, preferably by forming an average value from the determined measured values. Any measurement errors of a measuring device can thus be compensated for. Measurement errors can occur, for example, when the cable moves faster in the radial direction during advancement than the magnet holder can follow this radial movement. This can lead to brief deviations between the speed of rotation of the magnet and the advancement speed of the cable.

Furthermore, a system comprising two measuring devices according to the invention is provided, one measuring device being arranged on a trolley of a sewer cleaning and/or sewer inspection system and the other measuring device being arranged on a cable drum. "Arranged on a cable drum" means here that the other measuring device is assigned to the cable drum. This allows the advancement of a cable to be measured both on the cable drum and on the trolley. In the most favorable case, the deviation between the two measured advancements is zero or at least negligibly small. If the two measured advancements deviate from one another, measures can be taken to compensate for this difference again. For example, the advancement on the cable drum can be accelerated if the advancement measured on the cable drum is less than the advancement measured on the trolley.

A method is also provided for measuring an advancement of a cable of a sewer cleaning and/or sewer inspection system, wherein at least one rotatably mounted magnet is arranged relative to the cable in such a way that an advancement of the cable causes the at least one rotatably mounted magnet to rotate,
a magnetic field sensor is arranged relative to the at least one rotatably mounted magnet in such a way that rotations of the at least one rotatably mounted magnet can be detected therewith, wherein the advancement of the cable is determined from the detected rotations, and
radial movements of the cable during advancement of the cable are compensated by the at least one rotatably mounted magnet following the radial movements of the cable, such that the rotation of the at least one rotatably mounted magnet is produced even in the event of a radial movement of the cable during advancement of the cable.

At least one measuring device according to the invention can be used to measure the advancement of the cable.

The cable may be a push rod or a power cable or a data cable or a combination thereof.

BRIEF DESCRIPTION OF THE DRAWINGS

Further details and features of the inventions as well as specific, in particular advantageous, embodiments of the invention are apparent from the following description in conjunction with the drawings, in which.

DETAILED DESCRIPTION

Embodiments of the invention are described below on the basis of a cable. According to the invention, a push rod may also be used instead of a cable.

The materials and methods of the present invention are in no way restricted to the embodiments described below, but rather serve to better understand the invention. Nevertheless, the materials and methods described below are advantageous embodiments of the invention.

When a "linear" advancement of a cable or push rod is mentioned below, this means that a cable or push rod is advanced, i.e. conveyed, along its longitudinal axis. Within the context of the invention, this also means the unwinding or winding of a cable or push rod from a cable drum or onto a cable drum with the aid of a propulsion system.

In the following, "advancement" always means conveying of the cable or push rod in one or the other direction relative to the propulsion system. This means that, during advancement, the cable or push rod is pushed into the sewer or pushed out of the sewer (if the propulsion system is in the sewer, for example on a trolley) or pulled out thereof (if the propulsion system is outside the sewer, for example located on a cable drum).

Figure 1:
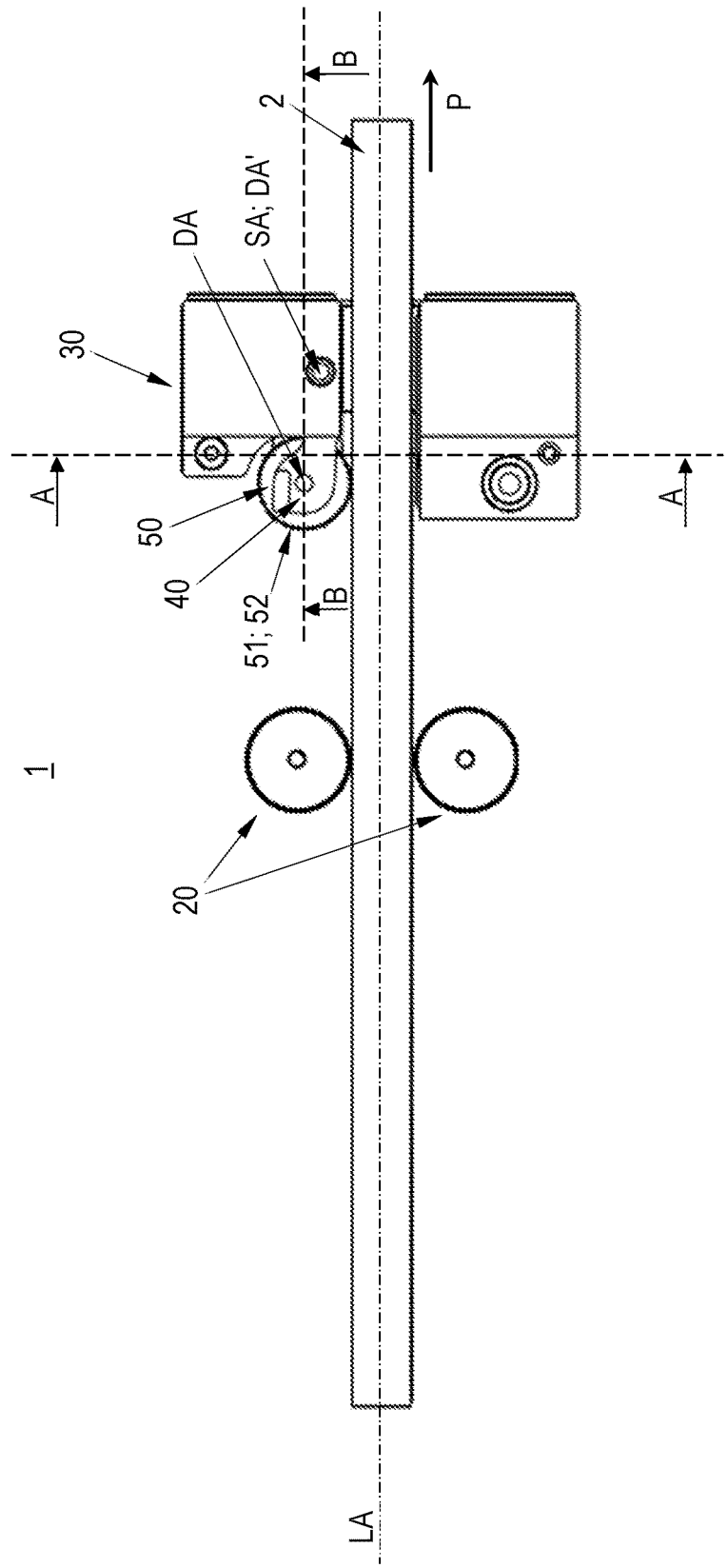
FIG. 1 shows a propulsion system for advancing a cable.

FIG. 1 shows an embodiment of a propulsion system 1 for advancing a cable 2 of a sewer cleaning and/or sewer inspection system.

By means of the propulsion system 1, the cable 2 can be pushed or conveyed forwards (in the direction of the arrow P) or backwards (counter to the direction of the arrow P). The cable 2 may be a relatively rigid cable, the propulsion system 1 also being suitable for advancing less rigid or slack cables. By means of the propulsion system 1, push rods, in particular, can also be advanced, which as a rule are designed to be very rigid.

Inspection units (e.g. cameras) or tools (e.g. grippers) may be arranged at the front end of the cable 2 or push rod.

The propulsion system 1 comprises a propulsion device 20. The propulsion device 20 here comprises two wheels or rollers, at least one of the two wheels/rollers being driven. The cable is clamped between the two wheels. By means of the driven wheels/rollers, which rest on the surface of the cable, the cable is moved when the wheels/rollers turn. The second wheel or the second roller serves as a counter wheel or counter roller that is not driven.

As an alternative to the two wheels/rollers, two drive belts may also be provided, one of the two belts also being driven here. However, both belts may also be driven.

In yet another alternative, the propulsion device 20 may comprise a roller/wheel and a belt, the belt preferably being driven.

In yet another alternative, the propulsion device 20 may comprise a clamping jaw drive for advancing the cable 2.

The feature common to all embodiments of a propulsion device 20 described above is that, when the cable 2 is advanced, the advancing force can be greater than the static friction between the propulsion device 20 and the cable 2, which can result in slippage between the cable and the propulsion device 20. This is particularly (but not only) the case when the surface of the cable 2 or the rollers/belts/wheels are dirty or damp, which results in the static friction between the propulsion device 20 and cable 2 being significantly reduced.

A challenge when advancing a cable 2 of a sewer cleaning and/or sewer inspection system is that of detecting such slippage during advancement of the cable 2 as soon as possible after it occurs in order to be able to correctively intervene in the propulsion system, to adjust the rate of advance somewhat, or to switch off the propulsion system in the event of extreme slippage.

In order to identify/detect slippage (hereinafter also referred to as slip detection), the propulsion device 20 is adapted to provide a first measured value M1 of the advancement. The first measured value M1 indicates how far the propulsion device 20 would have advanced the cable 2 under ideal conditions, i.e. without slippage. The first measured value M1 can be derived, for example, from the number of revolutions of the drive wheels. The propulsion device 20 comprises suitable detection means for this, which are known per se from the prior art. However, in the event of slippage, the first measured value M1 deviates from the actual advancement.

Furthermore, the propulsion system 1 comprises a measuring device 10 for measuring the advancement of the cable 2, only the compensation device 30 of the measuring device being visible in FIG. 1. By means of the measuring device, an advancement of the cable is detected or measured independently of the propulsion device 20.

The measuring device here comprises a compensation device 30 and a magnetic field sensor, which cannot be seen in FIG. 1. The magnetic field sensor is adapted to detect rotations of a magnet that is part of the compensation device 30, it being possible to derive a measure for the advancement of the cable 2 from the number of detected rotations of the magnet. Based on the number of detected rotations of the magnet, the measuring device provides a second measured value M2 of the advancement independently of the propulsion device 20. The second measured value M2 indicates how far the cable 2 was actually advanced. The measuring device is described in detail with reference to FIGS. 2 to 7.

The propulsion system 1 also comprises an evaluation unit 80 (see FIG. 9), which is adapted to process the first measured value M1 provided by the propulsion device 20 and the second measured value M2 provided by the measuring device 10. The method steps for processing the two measured values M1, M2 and the reduction in the slippage of the cable 2 made possible thereby are described in detail with reference to FIG. 8.

The evaluation unit 80 essentially calculates a difference $\Delta M$ between the first measured value M1 and the second measured value M2, and compares this difference with a predetermined threshold value T. If the threshold value T is exceeded, there is a certain amount of slippage that should or must be reduced.

If the amount of the difference $\Delta M$ equals zero, then the cable is advanced without slippage. If the amount of the difference $\Delta M$ is between zero and the threshold value T, then there is a degree of slippage that can be tolerated. In one embodiment of the invention, the slippage can be reduced even when the difference $\Delta M$ is between zero and the threshold value T, such that advancement can be continuously regulated.

To reduce the slippage, the propulsion system 1 or the evaluation unit 80 comprises a control device 90, the control device being adapted to control the advancement of the cable 2 by the propulsion device 20. In one embodiment of the invention, the advancement of the cable 2 by the propulsion device 20 can be slowed if the amount of the difference ΔM between the first measured value M1 and the second measured value M2 exceeds the predetermined threshold value T. However, the advancement of the cable 2 through the propulsion device 20 may also be slowed as soon as the amount of the difference ΔM between the first measured value M1 and the second measured value M2 is greater than zero.

The control device 90 may be adapted to slow down the advancement or the propulsion device, preferably to slow same down in stages, until the amount of the difference ΔM between the first measured value M1 and the second measured value M2 falls below the predetermined threshold value T again or until the amount of the difference ΔM between the first measured value M1 and the second measured value M2 is again zero or close to zero.

In an alternative embodiment, the advancement of the cable 2 may also be accelerated when the predetermined threshold value T is exceeded. This may be necessary, for example, when the advanced cable lags behind another unit advanced in the sewer due to the slippage and the associated reduced advancement rate, i.e. is advanced more slowly than the other unit due to the slippage. For example, two cables may be pushed into a sewer independently of one another, for example each by means of a propulsion system 1 shown here. If slippage occurs on the cable in one of the propulsion systems but no slippage occurs in the other propulsion system, then the cable advanced by said former propulsion system will lag behind the other cable. In order to make up for this "lag" caused by the slippage, the advancement of the cable is accelerated.

In another embodiment of the invention, the cable 2 may be advanced by means of two mutually independent propulsion devices 20. One propulsion device may be arranged on a trolley located in the sewer that, for example, pushes a push rod into a side channel. The other propulsion device may be arranged on a cable drum which is located outside the sewer and which unwinds the push rod from the cable drum and pushes it into the sewer (in the direction of the trolley). In this case, the propulsion device of the trolley may push the push rod into the side channel without slippage, while the propulsion device of the cable drum pushes the push rod into the sewer with slippage. In order to the reduced advancement on the cable drum compared to the advancement on the trolley, which is caused by the slippage on the cable drum, the advancement by the propulsion device of the cable drum may be accelerated.

The propulsion device 20 is accordingly intended to effect the advancement of the cable 2 (in the direction of the arrow P or counter to the direction of the arrow P) and at the same time to provide a first measured value M1 which represents the target advancement (the target advancement may deviate from the advancement actually effected (=actual feed) due to slippage). The measuring device 10 is accordingly provided for measuring the effective advancement of the cable 2 (=actual advancement, which is provided as the second measured value M2), i.e. the advancement actually effected by the propulsion device 20. If the cable 2 is advanced by the propulsion device 20 without any slippage, the two measured values M1 and M2 do not differ from one another, or only differ from one another by a negligibly small value.

As explained above, the control device 90 may be adapted to adjust (accelerate or slow down) the advancement if the difference ΔM between the first measured value M1 and the second measured value M2 exceeds the predetermined threshold value T. In one embodiment of the invention, however, the advancement may also be adjusted if the amount of the difference ΔM is between zero and the threshold value T. For example, by accelerating the propulsion device (e.g. drive belt or drive wheel), if necessary, more static friction can again be generated between the propulsion device and the push rod/cable, such that the difference can be compensated for or reduced before the threshold value T is reached. If the threshold value T is nevertheless exceeded, alternative measures can be initiated, for example the entire system can be switched off in order to avoid damage to the system and/or to the push rod/cable.

In the following, embodiments of a measuring device 10 are presented with reference to FIGS. 2 to 7. As described with reference to FIG. 1, the measuring device 10 may be part of a propulsion system 1 and thus make a significant contribution to the detection of slippage of the cable 2. Alternatively, the measuring device may be used independently of a propulsion system for measuring an advancement of a cable 2.

Figure 2:
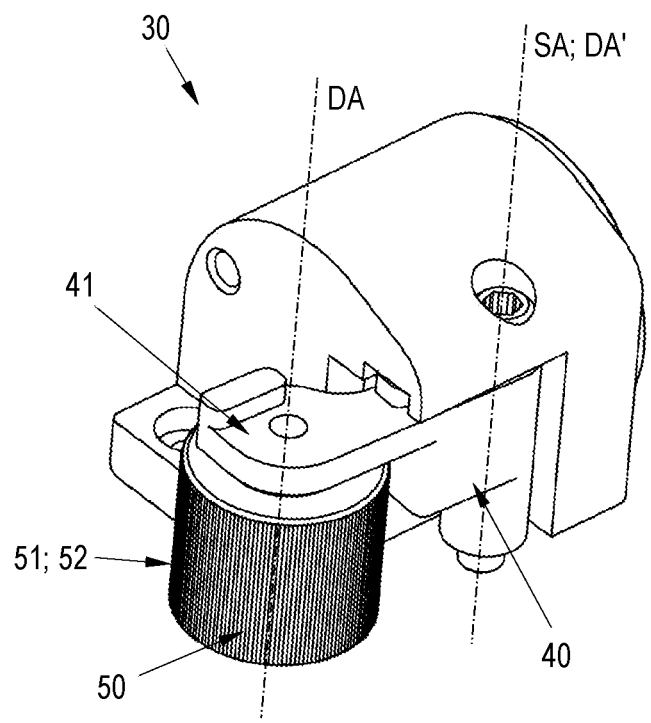
FIG. 2 is a perspective view of a compensation device of a measuring device for measuring an advancement of a cable.

FIG. 2 is a perspective view of a compensation device 30 of a measuring device 10 for measuring an advancement of a cable 2.

The compensation device 30 comprises a magnet 50 mounted so as to be rotatable about an axis of rotation DA and a magnet holder 40 for receiving the magnet 50. The magnet holder 40 is designed here as a pivot device that can be pivoted about a pivot axis SA. An alternative embodiment of a compensation device 30 is described with reference to FIG. 11.

In the embodiment shown in FIG. 2, the pivot device 40 comprises a pivot arm 41, at the free end of which the magnet 50, which is mounted so as to be rotatable about the axis of rotation DA, is arranged. The pivot arm 41 is pivoted by applying an actuating force. The actuating force is provided by an actuator or actuating means, for example a spring element. The actuating force acting on the pivot arm causes the free end of the pivot arm 41 and thus also the magnet 50 arranged there to be pivoted in the direction of the cable 2.

The rotatably mounted magnet 50 is designed here as a diametrically magnetized ring magnet, it also being possible for the magnet 50 to be a diametrically magnetized disc magnet or to have a different shape, provided that the magnet 50 is magnetized perpendicularly to the axis of rotation DA. The magnet 50 has at least one north pole and at least one south pole. In FIG. 2, the magnet 50 is arranged on the underside of a rotatably mounted element 52.

In this embodiment, the rotatably mounted element 52 simultaneously forms a housing 51 in which the magnet 50 is arranged. The housing 51 may generally have a shape that is rotationally symmetrical about the axis of rotation DA, the cylindrical shape shown in FIG. 2 being merely an example.

In one embodiment, the housing 51 may have a concavely curved surface that is adapted to a convexly curved surface of the cable 2, such that the housing makes an effective contribution to guiding the cable 2. Movements of the cable along the longitudinal axis of the housing 51 can thus be reduced or avoided.

When the cable 2 is advanced, the cable 2 is guided past the compensation device 30. The rotatably mounted magnet 50 is arranged on the magnet holder 40 or on the pivot device 40 in such a way that the advancement of the cable 2 causes rotations of the magnet 50 about the axis of rotation DA. Furthermore, the magnet holder 40 or the pivot device 40 of the compensation device 30 is adapted to follow a movement of the cable 2, in particular a movement of the cable in the radial direction, during the advancement. This ensures that, even in the event of a radial movement of the cable 2, i.e. when the cable moves away from the magnet 50, the rotation of the magnet 50 is brought about by the cable 2 during advancement. In the embodiment shown in FIG. 2, the housing 51 or the rotatably mounted element 52 touches the cable 2 (see FIG. 1) such that the linear advancement of the cable 2 causes rotations of the rotatably mounted element 52 and thus of the rotatably mounted magnet 50 about the axis of rotation DA.

Figure 3:
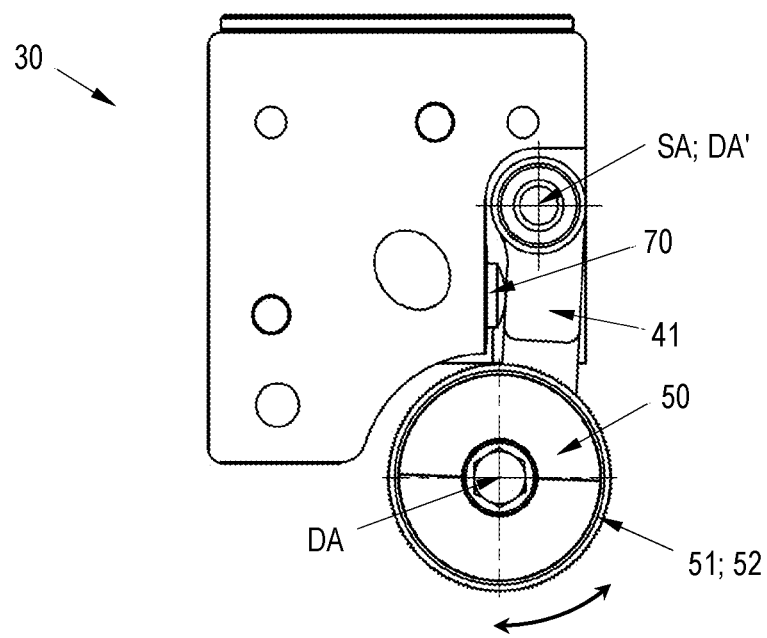
FIG. 3 shows the compensation device from FIG. 2 in a view from below.

FIG. 3 shows the compensation device 30 from FIG. 2 in a view from below.

This view also shows an embodiment of the actuator 70 as a spring element. The pivot arm 41 is acted upon by an actuating force by means of the spring force provided by the spring element, which causes the pivot device 40 to pivot about the pivot axis SA. This ensures that the magnet holder 40 or the pivot device 40 follows the radial movement of the cable 2, since the spring force acting on the pivot arm 41 ensures that the free end of the pivot arm 41 is permanently pressed against the cable 2 that is guided past.

The magnet 50 is arranged in an element 52 that is mounted so as to be rotatable about the axis of rotation DA, the rotatably mounted element 52 forming a housing 51 for the rotatably mounted magnet 50 and being arranged here at the free end of the pivot arm 41. By means of the actuating force of the actuator 70 or spring element 70, the pivot arm 41 of the pivot device 40 is pushed towards the cable 2 in such a way that the housing 51 or the rotatably mounted element 52 touch the cable 2. This has the effect that an advancement of the cable 2 sets the rotatably mounted element 52 or the housing 51 in rotation, as a result of which the magnet arranged in the rotatably mounted element 52 or housing 51 is also set in rotation about the axis of rotation DA.

In another embodiment, the actuator 70 or the spring element 70 may be integrated into the pivot axis SA and thus also generate an actuating force that causes the magnet holder 40 or the pivot device 40 to pivot about the pivot axis SA.

In the following, the position information "left," "right," "below" and "above" refer to the cable 2 to be advanced.

Figure 4:
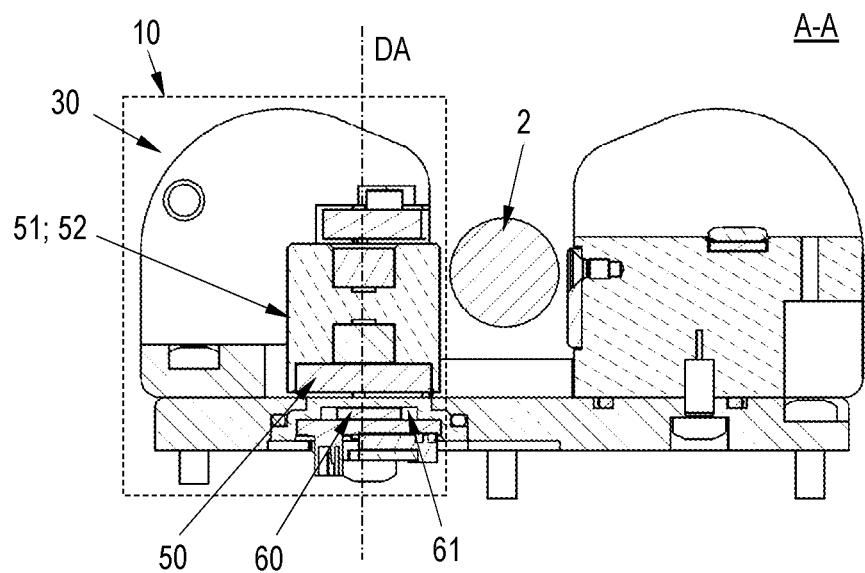
FIG. 4 is a sectional view of the measuring device along the section A-A shown in FIG. 1.

FIG. 4 is a sectional view of the measuring device 10 along the section A-A shown in FIG. 1.

In the illustration in FIG. 4, the compensation device 30 is arranged to the left of the cable 2 to be advanced. An arrangement of the measuring device 10 on the right, below or above the cable 2 to be advanced would be equally conceivable.

Here, the magnet 50 is arranged in a housing 51, which in turn is mounted so as to be rotatable about the axis of rotation DA. As a result, the magnet 50 can also be rotated about the axis of rotation DA.

In one embodiment of the invention, the magnet 50 may also be arranged on the pivot arm such that it can rotate about the axis of rotation DA without a housing. This applies equally to all embodiments of the invention presented herein.

The magnetic field sensor 60 is arranged at a distance from the rotatably mounted magnet 50 of the compensation device 30. The magnetic field sensor 60 is arranged so as to be stationary, i.e. non-movable, such that the magnet 50 rotates relative to the magnetic field sensor 60. In the embodiment shown in FIG. 4, the magnetic field sensor 60 is arranged below the magnet 50.

In the embodiment shown in FIG. 4, the magnetic field sensor 60 is arranged in a space 61 having a positive pressure. An arrangement in a space having a negative pressure is also possible.

It is advantageous if the magnetic field sensor 60 is arranged so as to be offset with respect to the axis of rotation DA of the magnet 50. This ensures that the magnetic field sensor 60 can detect the rotations of the magnet 50, which is designed here as a diametrically magnetized ring magnet. The rotations of the magnet 50 cause a change in the magnetic flux over time in the measuring range of the magnetic field sensor 60, as a result of which the rotations of the magnet 50 can be detected. The rotations detected by the magnetic field sensor 60 are a measure of the advancement of the cable 2.

In another embodiment not shown here, two measuring devices 10 may be provided, one measuring device 10 being arranged on one side of the cable 2 and the other measuring device 10 being arranged on the other (opposite) side of the cable 2. The magnetic field sensors 60 of the two measuring devices 10 can thus detect the rotations of the relevant magnet independently of one another. An average value can be formed from the measured values provided by the two measuring devices 10 and then be used as a measure for the advancement of the cable 2.

Figure 5:
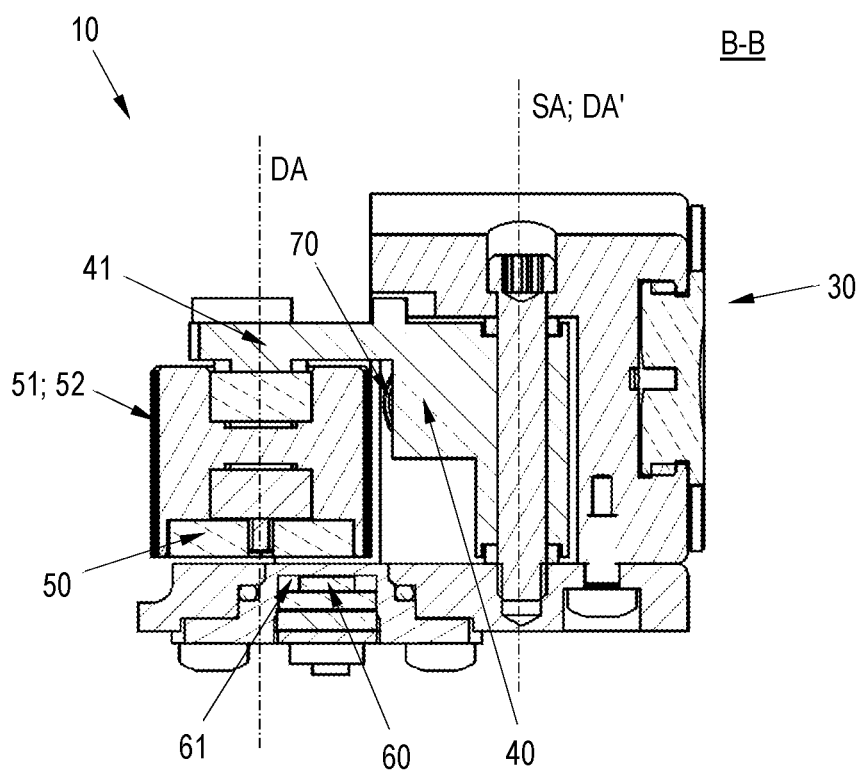
FIG. 5 is a sectional view of the measuring device along the section B-B shown in FIG. 1.

FIG. 5 is a sectional view of the measuring device or the compensation device 30 along the section B-B shown in FIG. 1.

The pivot arm 41, at the free end of which the magnet 50 is arranged, is clearly visible here. Here, too, the magnet 50 is accommodated in a housing 51, which is arranged on the pivot arm 41 so as to be rotatable about the axis of rotation DA. The arrangement of the magnetic field sensor 60 offset with respect to the axis of rotation DA can also be seen here, as can the actuator 70, which is pressing against the pivot arm 41 from behind.

In another embodiment of the measuring device 10, the magnetic field sensor 60 may be arranged on the magnet holder 40 or on the pivot arm 41 at a distance from the magnet 50. In this embodiment, the magnet 50, which is mounted so as to be rotatable about the axis of rotation DA, may also be arranged at the free end of the pivot arm 41. It can also be advantageous here if the magnetic field sensor 60 is arranged so as to be offset with respect to the axis of rotation DA of the magnet.

Figure 6:
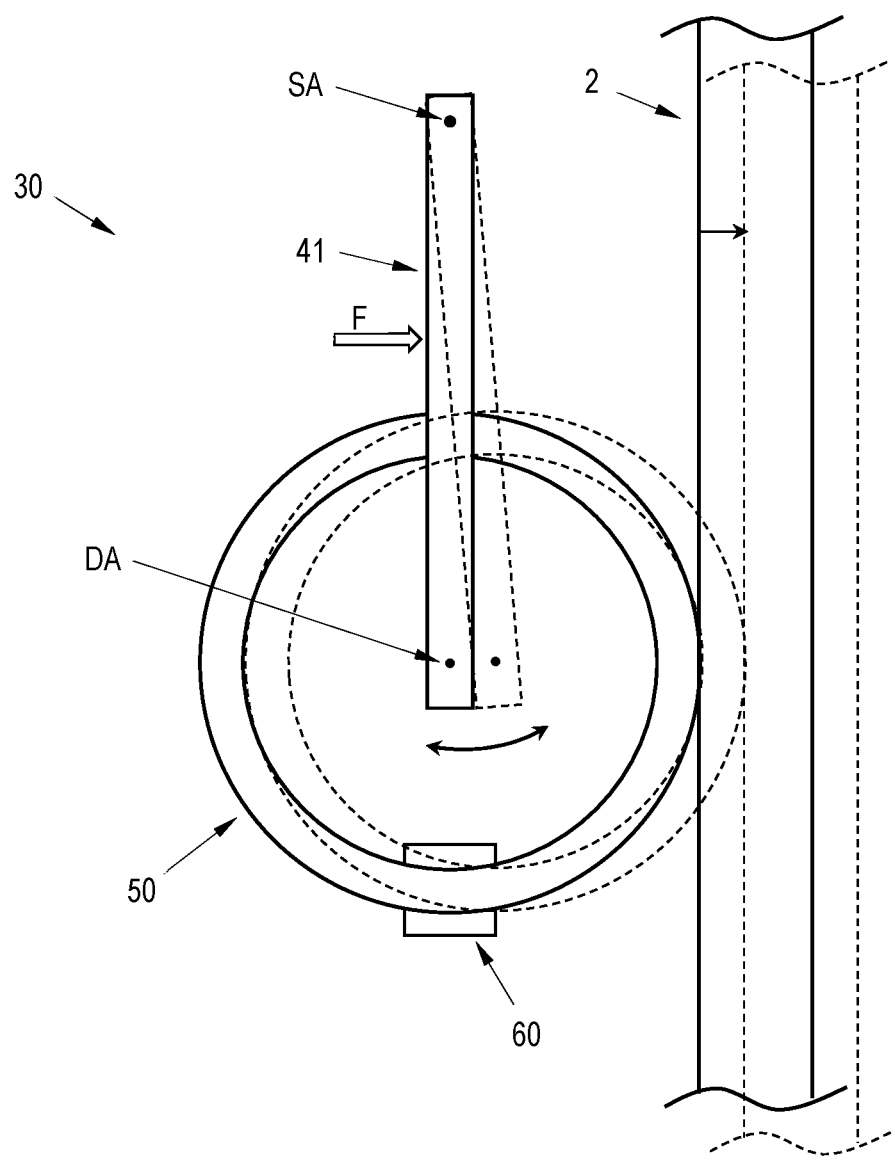
FIG. 6 shows an embodiment and the corresponding functioning of a measuring device.

FIG. 6 shows the functioning of the pivot device 40 of an embodiment of the compensation device 30.

The pivot device is arranged so as to be pivotable about the pivot axis SA and comprises a pivot arm 41. A magnet 50 that is mounted so as to be rotatable about an axis of rotation DA is arranged at the free end of the pivot arm 41, the rotatably mounted magnet touching the cable 2. A magnetic field sensor 60 is arranged at a distance from the rotatably mounted magnet 50 and is adapted to detect rotations of the rotatably mounted magnet 50 about the axis of rotation DA, the detected rotations being a measure of the advancement of the cable 2.

In the event of a radial movement of the cable 2, shown in FIG. 6 by the dashed lines, the rotatably mounted magnet 50 follows the cable 2 by means of the pivot device 40 or pivot arm 41 pivoting about the pivot axis SA. The pivoting of the pivot arm 41 can be brought about by means of an actuating force F acting on the pivot arm 41. The actuating force F may for example be provided by a spring element.

This ensures that the rotatably mounted magnet 50 touches the cable 2 even in the event of a radial movement of the cable 2, such that the cable 2 causes the rotatably mounted magnet 50 to rotate continuously about the axis of rotation DA during advancement.

The rotatably mounted magnet 50 is mounted with as little friction as possible.

Figure 7:
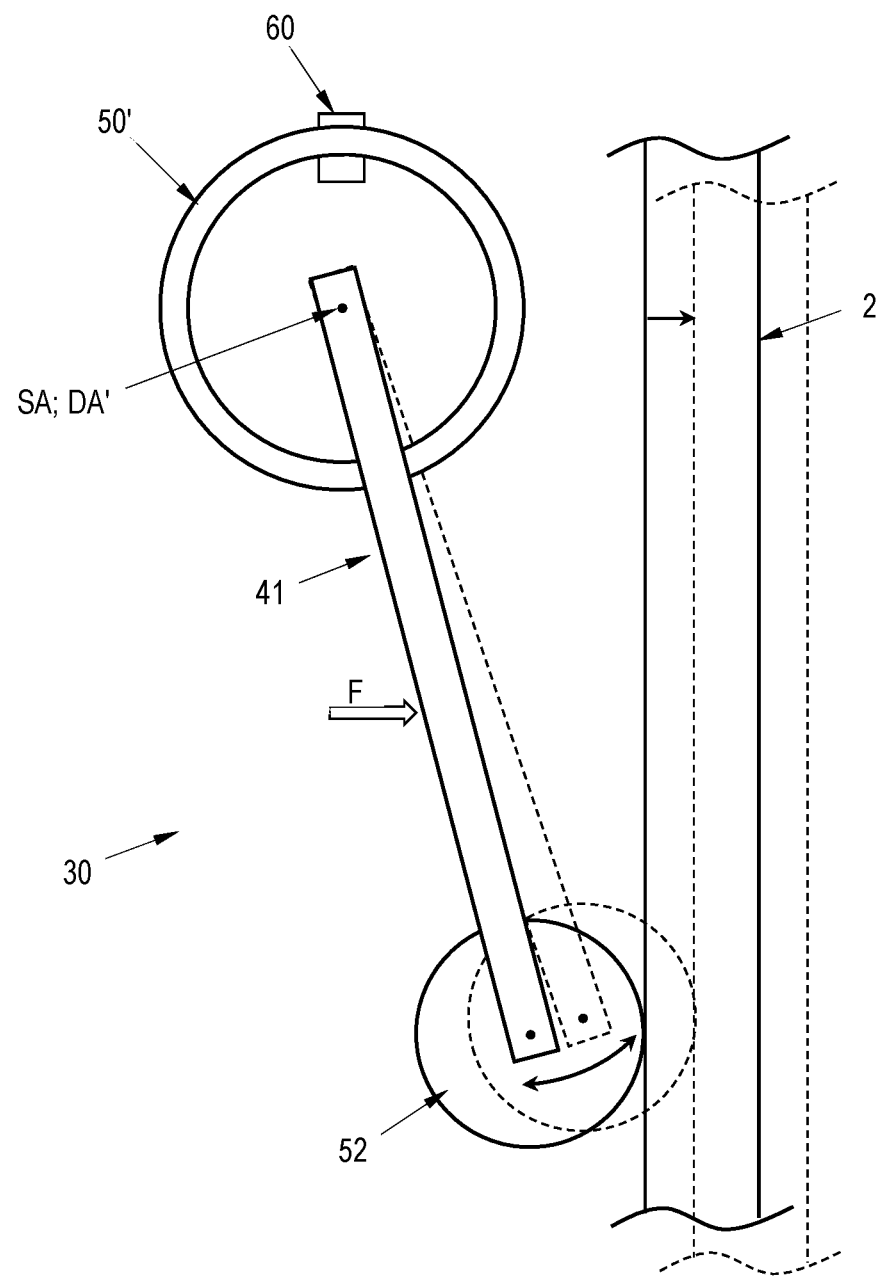
FIG. 7 shows an alternative embodiment and the corresponding functioning of a measuring device.

FIG. 7 shows the functioning of the pivoting device 40 of an alternative embodiment of the compensation device 30.

Here, too, the pivot device 40 is arranged so as to be pivotable about the pivot axis SA and comprises a pivot arm 41. According to this alternative embodiment, the magnet 50' is arranged so to be rotatable about the pivot axis SA. In this case, the axis of rotation DA', about which the magnet can be rotated, coincides with the pivot axis SA. The magnet 50' may also be arranged in a housing 51 in this embodiment.

In this alternative embodiment, an element 52 mounted so as to be rotatable about an axis of rotation is arranged at the free end of the pivot arm 41 in such a way that the advancement of the cable 2 causes rotations of the rotatably mounted element 52.

The rotatably mounted element 52 can be or is coupled to rotatably mounted magnets 50'. The rotatably mounted element 52 and the rotatably mounted magnet 50' may be coupled via a belt, for example. As a result of the coupling, rotations of the rotatably mounted element 52 can be transmitted to the rotatably mounted magnet 50' in order to rotate the rotatably mounted magnet 50'.

The magnetic field sensor 60 is arranged at a distance from the rotatably mounted magnet 50' and is adapted to detect rotations of the rotatably mounted magnet 50' about the axis of rotation DA', the detected rotations also being a measure for the advancement of the cable 2 here.

In the event of a radial movement of the cable 2, shown in FIG. 7 by the dashed lines, the rotatably mounted element 52 follows the cable 2 by means of a pivoting of the pivot arm 41. The pivoting of the pivot arm 41 may also be brought about here by means of an actuating force F acting on the pivot arm 41. The actuating force F may for example be provided by a spring element.

This ensures that the rotatably mounted element 52 touches the cable 2 even when the cable 2 moves radially, such that the cable 2 causes continuous rotations of the rotatably mounted element 52 about the axis of rotation DA during advancement, the rotations of the element 52 also causing rotations of the magnet 50' about the axis of rotation DA' on account of the coupling.

Figure 8A:
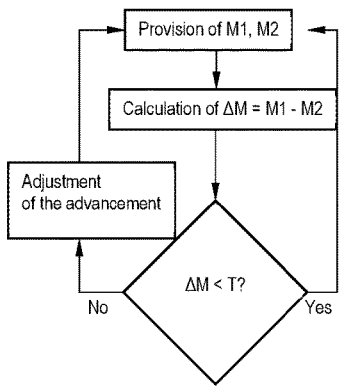
FIG. 8a shows a first variant of a method for detecting slippage during advancement of a cable.

FIG. 8a is a flow chart of a first variant of a method for detecting slippage when a cable 2 is being advanced.

In the method for reducing slippage of a cable 2, a first measured value M1 of the advancement of the cable 2 is determined. Furthermore, a second measured value M2 of the advancement of the cable 2 is determined independently of the first measured value M1. The first measured value M1 and the second measured value M2 can be determined with a predetermined frequency. The second measured value M2 represents the actually performed advancement of the cable 2 (=actual advancement).

A difference ΔM is formed between the first measured value M1 and the second measured value M2, and the advancement of the cable 2 is adjusted (slowed down or accelerated) if the amount of the difference ΔM exceeds a predetermined threshold value T.

In one embodiment of the method, the second measured value M2 can be determined by means of the measuring device 10 described above. To determine the second measured value M2, a rotatably mounted magnet 50; 50' that is rotated by means of the advancement of the cable 2 is arranged on the cable 2. Furthermore, a magnetic field sensor 60 is arranged relative to the magnet 50; 50', the rotations of the magnet 50; 50' being detected by means of the magnetic field sensor 60 such that the second measured value M2 can be derived from the detected rotations. This also applies to the methods described with reference to FIGS. 8b and 8c.

In an alternative embodiment of the method according to the invention, the advancement of the cable 2 can be adjusted, preferably adjusted in stages, until the amount of the difference ΔM between the first measured value M1 and the second measured value M2 falls below the predetermined threshold value T again.

Figure 8B:
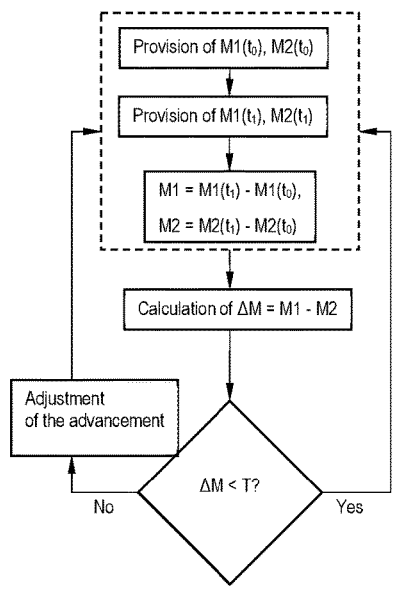
FIG. 8b shows a second variant of a method for detecting slippage during advancement of a cable.

FIG. 8b shows a variant of the method in which the measured values M1 and M2 each represent the difference in the advancement of the cable 2 over a predetermined time period.

Figure 8C:
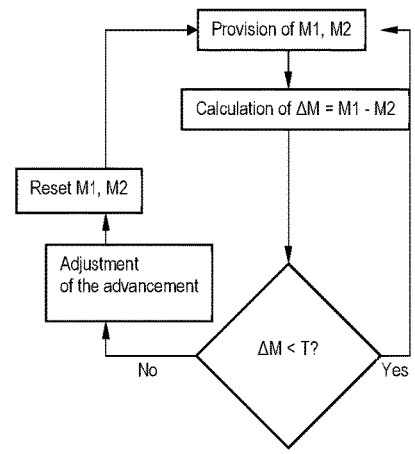
FIG. 8c shows a third variant of a method for detecting slippage during advancement of a cable.

FIG. 8c shows another variant of the method in which the measured values M1 and M2 each represent the last measured advancement of the cable 2. The two variants are described below on the basis of a run-through of the method steps.

In the variant shown in FIG. 8b, the linear advancement of the cable 2 can for example be measured with a predetermined frequency. The values measured at the measuring time $t_0$ for the first measured value $M1(t_0)$ and the second measured value $M2(t_0)$ of the advancement of the cable are temporarily stored and provided. Likewise, the measured values at the current measuring time $t_1$, that is to say the first measured value $M1(t_1)$ and the second measured value $M2(t_1)$ for the advancement of the cable 2, are provided and temporarily stored. Based on the measured values provided, the first measured value M1 and the second measured value M2 are each determined from the difference between the measured values at the current measuring time $t_1$ and the measured values at the previous measuring time $t_0$. Thus, the first measured value M1 and the second measured value M2 each represent the stretch of the cable 2 that was linearly advanced in the last elapsed time period between $t_0$ and $t_1$. A difference ΔM is formed between the first measured value M1 and the second measured value M2, and the advancement of the cable 2 is adjusted if the amount of the difference ΔM exceeds a predetermined threshold value T. Before the next run, the measured values at the current measuring time $t_1$ are temporarily stored as measured values for the previous measuring time $t_0$.

In the variant shown in FIG. 8c, the advancement of the cable 2 may also be measured with a predetermined frequency. The first measured value M1 and the second measured value M2 are each determined and provided at the current measuring time. In contrast to the variant shown in FIG. 8b, the measured values from previous measuring times are no longer required. A difference ΔM is formed between the first measured value M1 and the second measured value M2, and the advancement of the cable 2 is slowed if the amount of the difference ΔM exceeds a predetermined threshold value T. If slippage of the cable 2 was detected, the first measured value M1 and the second measured value M2 are each reset to zero for the next check for slippage of the cable 2.

In another variant, not shown here, the first measured value M1 and the second measured value M2 may each also be averaged from a plurality of measurements over a predetermined period of time, or filtered in some other way, in order to minimize noise of the first measured value M1 and/or of the second measured value M2.

Figure 9:
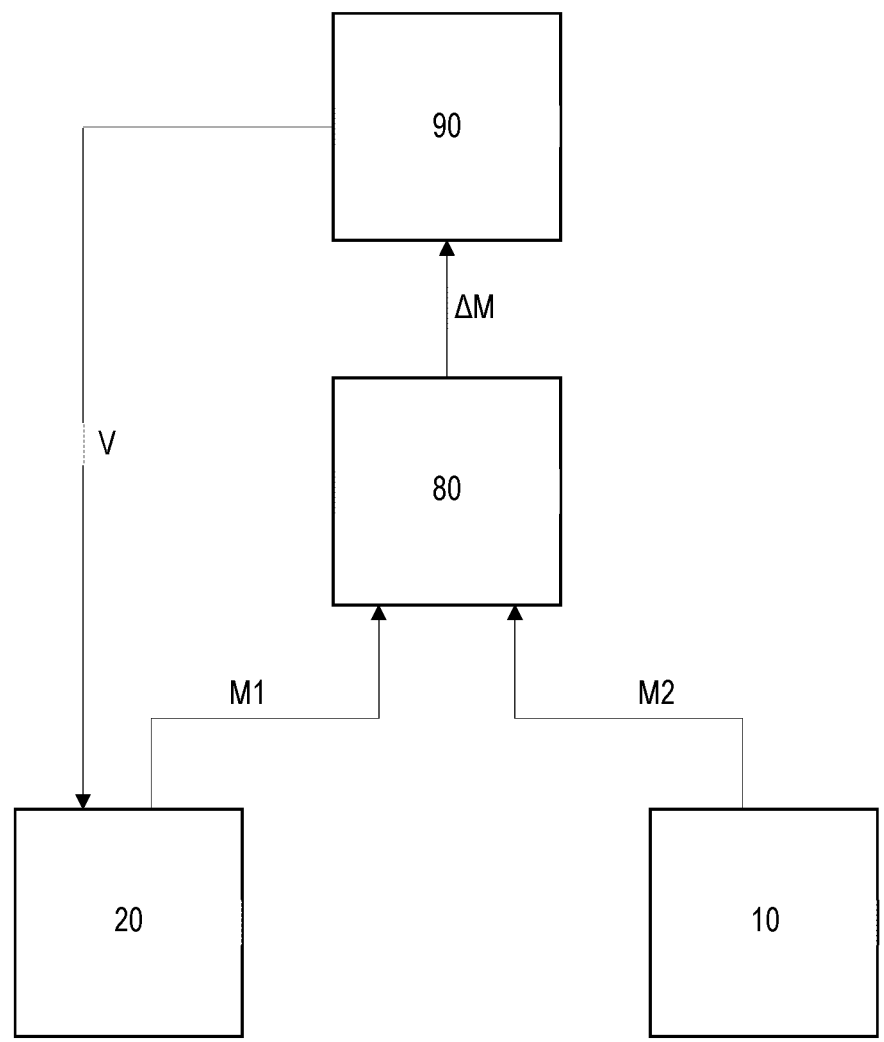
FIG. 9 is a block diagram of a propulsion system for explaining a method for reducing slippage during advancement of a cable.

FIG. 9 shows a block diagram of a propulsion system 1 for explaining a method for reducing slippage when advancing a cable 2.

The propulsion device 20 of the propulsion system 1 is adapted to advance a cable 2 and thereby provide a first measured value M1 of the advancement (=target advancement) of the cable 2. Furthermore, the measuring device 10 of the propulsion system 1 is adapted to provide a second measured value M2 of the advancement (=actual advancement) of the cable 2.

The first measured value M1 and the second measured value M2 are made available or transmitted to an evaluation device 80, a difference ΔM being formed in the evaluation device 80 between the first measured value M1 and the second measured value M2.

In a variant of the method in which the first measured value M1 and/or the second measured value M2 are determined or filtered from a plurality of measured values as described above, the evaluation device 80 may also determine or filter the first measured value M1 and/or the second measured value M2 from the plurality of measured values.

The first measured value M1 and the second measured value M2 are determined at the same point in time or over the same period of time, such that the difference ΔM between the first measured value M1 and the second measured value M2 is below a predetermined threshold value T, i.e. is essentially zero, when the cable 2 is advanced without slippage.

The evaluation device 80 is coupled or can be coupled to a control device 90, such that data and, if applicable, program commands can be exchanged between the evaluation device 80 and the control device 90. The control device 90 controls the advancement of the cable 2 by the propulsion device 20. If the amount of the difference ΔM exceeds a predetermined threshold value T, the control device 90 effects an adjustment V of the advancement of the cable 2. By means of the adjustment V of the advancement, slippage of the cable 2 can be reduced.

The evaluation device 80 and the control device 90 may be designed as a unit.

Figure 10:
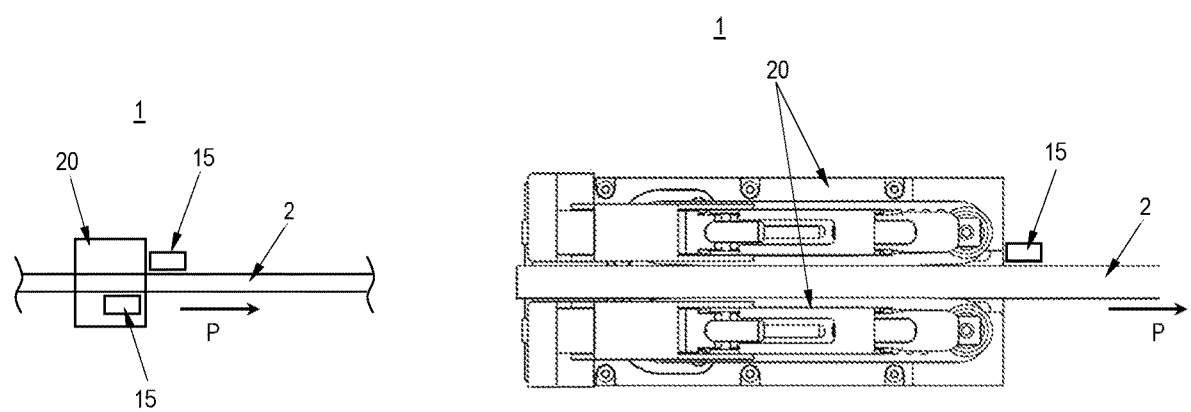
FIG. 10 shows an alternative embodiment of a propulsion system.

FIG. 10 shows an alternative embodiment of the propulsion system 1 for advancing a cable 2 of a sewer inspection and/or maintenance system. In this case, the cable 2 may also be a push rod.

The propulsion system 1 shown in FIG. 10 comprises a propulsion device 20 for advancing the cable 2 and in this case comprises a belt drive. The propulsion system 1 further comprises a temperature sensor 15, 15', the temperature sensor 15, 15' being arranged in the region of the propulsion device 20 or following on from the propulsion device 20 in the advancement direction (arrow P) of the cable 2.

The temperature sensor 15 is preferably adapted to detect a temperature of the cable 2. The temperature of the cable in this case denotes the externally determinable temperature on the surface of the cable 2, thus essentially the temperature of the cable sheath or the outer layer of the push rod. The temperature sensor 15' is preferably adapted to detect a temperature of the propulsion elements, for example of the belts of the belt drive.

The propulsion system 1 also comprises an evaluation device 80 and a control device 90 here. The temperature sensor 15, 15' can provide the evaluation device 80 with the detected temperature of the cable 2 or of the propulsion elements. The evaluation device 80 and the control device 90 can be coupled or are coupled for exchanging data.

Furthermore, the control device 90 can control the advancement of the cable 2 by the propulsion device 20. The evaluation device 80 is adapted to check whether the detected temperature is above or below a predetermined threshold value T. The control device is also adapted to adjust the advancement of the cable 2 by the propulsion device 20 if the detected temperature exceeds the predetermined threshold value T.

The temperature sensor 15, 15' can measure the temperature contactlessly, for example via an infrared measurement.

Preferably, the control device 90 is in this case also adapted to adjust the advancement of the cable 2 by the propulsion device 20, preferably to adjust same in stages, until the detected temperature falls below the predetermined threshold value T again.

In order to detect slippage when a cable 2 is being advanced, the measured temperature of the cable 2 or of the advancing elements can provide information about the presence of slippage, since the cable 2 or advancing elements can heat up quickly and to high temperatures in the event of slippage. In the event of slippage, an adjustment, in particular a slowing of the advancement, brings about an immediate reduction in the slippage and thus a significant reduction in the temperature of the cable or the advancing elements.

The method may be adapted in such a way that, when slippage is detected, the advancement is adjusted, preferably adjusted in stages, until the measured temperature falls below the predetermined threshold value T again.

Figure 11:
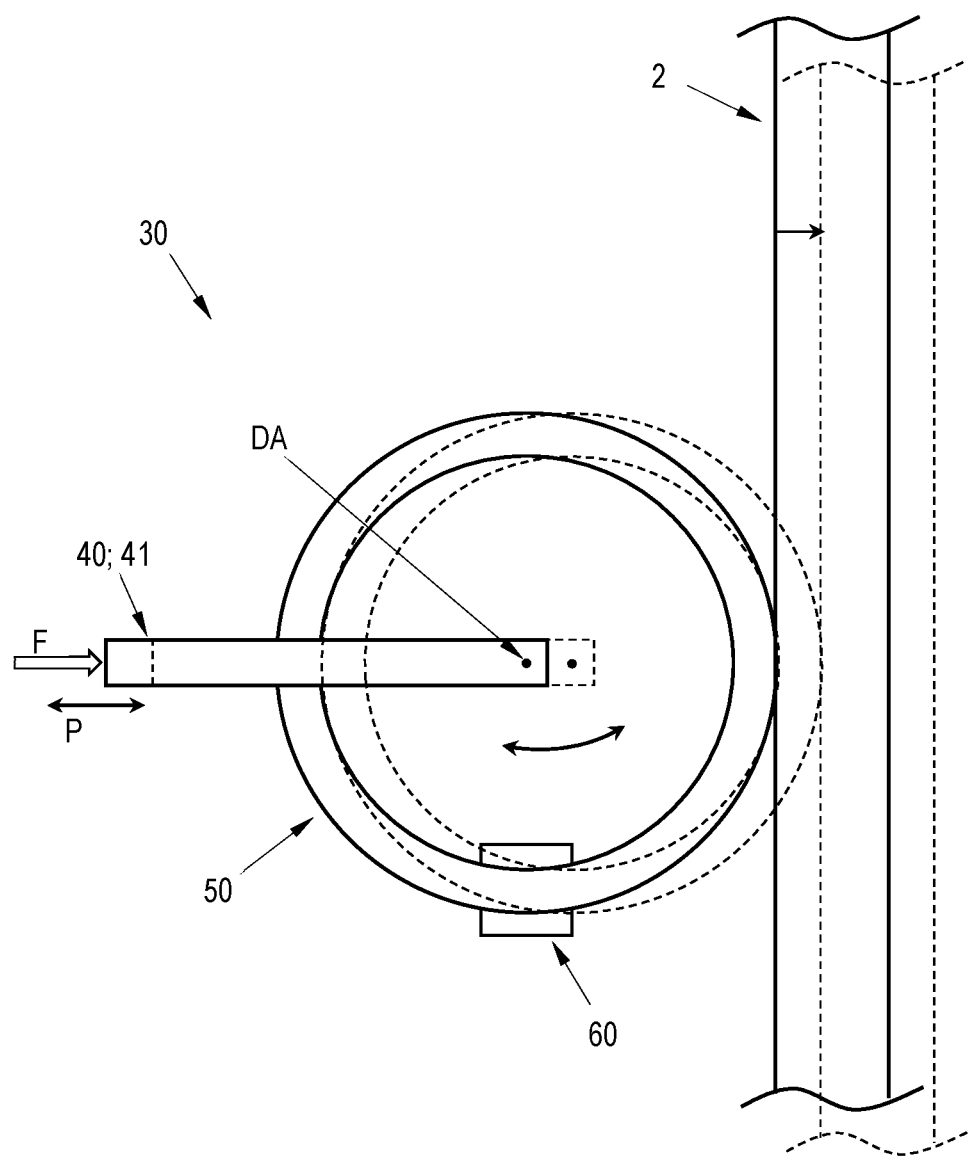
FIG. 11 shows another alternative embodiment and the corresponding functioning of a measuring device.

FIG. 11 shows another alternative embodiment and the corresponding functioning of a measuring device.

In this embodiment, the compensation device 30 of the measuring device 1 also comprises a magnet holder 40, which here comprises an arm 41. A magnet 50, which is mounted so as to be rotatable about an axis of rotation DA, is arranged at the free end of the arm 41, which faces the cable 2. According to this embodiment, the arm 41 itself is aligned substantially perpendicular to the cable 2 and is mounted so as to be movable linearly (in the direction of the arrow P). As in the above-described embodiments of the measuring device 1, the measuring device 1 here also comprises a magnetic field sensor 60, which is arranged at a distance from the magnet 50, such that the magnetic field sensor 60 can detect rotations of the magnet.

An actuating force F is applied to the magnet holder 40 or the arm 41 in order to move the arm 41 towards the cable 2 and thereby press the magnet 50 against the cable 2. The vector of the actuating force F is therefore substantially perpendicular to the longitudinal axis of the cable 2. An actuator, for example a spring element, may be provided for applying the actuating force F to the magnet holder 40 or the arm 41.

The actuating force acting on the magnet holder 40 or on the arm 41 causes the magnet 50 to follow a radial movement of the cable 2, such that it is ensured that the magnet 50 always rests on the cable and, during advancement, the cable rotates the magnet 50 irrespective of a radial movement. The units represented as dashed lines in FIG. 11 show a cable 2, which is being moved radially, and the compensation device 30, which is following the radial movement of the cable.

According to all of the above-described embodiments, the compensation device 30 is designed such that the magnet 50 can follow a radial movement of the cable 2 in any case, that is, if the cable moves to the right during advancement, then the magnet follows this movement and also moves to the right, and therefore the magnet is always on the cable.

REFERENCE SIGNS

1 Propulsion system
2 Cable
10 Measuring device
15, 15' Temperature sensor
20 Propulsion device for advancing the cable 2
30 Compensation device
40 Magnet holder (e.g. pivot device comprising pivot arm)
41 Arm or pivot arm of the magnet holder 40
50, 50' Rotatably mounted magnet
51 Housing
52 Rotatably mounted element
60 Magnetic field sensor
61 Space having a negative pressure/positive pressure
70 Actuator, e.g. spring element
80 Evaluation device
90 Control device
A-A Section A-A
B-B Section B-B
DA, DA' Axis of rotation
F Actuating force
LA Longitudinal axis of the cable 2 or of the propulsion system 1
M1 First measured value of the advancement of the cable 2
M2 Second measured value of the advancement of the cable 2
P Arrow; advancement direction of the cable 2
SA Pivot axis
T Threshold value
V Adjustment (slowing/acceleration) of the cable 2
ΔM Difference between the first measured value M1 and the second measured value M2

The invention claimed is:

1. A measuring device (10) for measuring an advancement of a cable (2) of a sewer cleaning and/or sewer inspection system, comprising:
a compensation device (30), comprising:
at least one magnet (50; 50') mounted so as to be rotatable about an axis of rotation (DA; DA'), and
a magnet holder (40) for receiving the at least one rotatably mounted magnet (50; 50'), and
a magnetic field sensor (60),
wherein
the cable (2) can be guided past the compensation device (30) while the cable (2) is being advanced,
the at least one rotatably mounted magnet (50; 50') is arranged on the magnet holder (40) in such a way that the advancement of the cable (2) can cause rotations of the at least one rotatably mounted magnet (50; 50') about the axis of rotation (DA; DA'), wherein the magnet holder (40) of the compensation device (30) is adapted to follow a movement of the cable (2) in the radial direction during advancement,
the magnetic field sensor (60) is stationarily arranged at a distance from the at least one rotatably mounted magnet (50; 50') and is adapted to detect the rotations of the at least one rotatably mounted magnet (50; 50'), wherein the detected rotations are a measure of the advancement of the cable (2), and
wherein the magnet holder (40) comprises a pivot arm (41), and the at least one rotatably mounted magnet (50) is arranged at a free end of the pivot arm (41) such that the at least one rotatably mounted magnet is pivotable relative to the magnetic field sensor.

2. The measuring device of claim 1, wherein the compensation device (30) comprises an actuator (70), in particular a spring element, which acts on the magnet holder (40), wherein the actuator (70) is designed to cause
a pivoting of the magnet holder (40) about a pivot axis (SA) or
a linear displacement of the magnet holder (40),
as a result of which the magnet holder (40) follows the radial movement of the cable (2).

3. The measuring device of claim 2, wherein the actuator (70) is arranged relative to the magnet holder (40) in such a way that the application of an actuating force to the magnet holder (40) by the actuator (70) presses the at least one magnet (50; 50') rotatably mounted on the magnet holder (40) onto the cable (2) that is being guided past.

4. The measuring device of claim 2, wherein the pivot axis (SA) forms the axis of rotation (DA') of the at least one rotatably mounted magnet (50').

5. The measuring device of claim 1, wherein the at least one rotatably mounted magnet (50; 50') is arranged in a housing (51), wherein the housing (51) preferably has a rotationally symmetrical shape, in particular a cylindrical shape.

6. The measuring device of claim 1, further comprising a rotatably mounted element (52) which is arranged on the magnet holder (40) in such a way that rotations of the rotatably mounted element (52) can be caused by the advancement of the cable (2), wherein
the rotatably mounted element (52) can be coupled to the at least one rotatably mounted magnet (50; 30'), and
the rotations of the rotatably mounted element (52) can be transmitted to the at least one rotatably mounted magnet (50; 50') by means of the coupling with the at least one rotatably mounted magnet (50; 50') in order to rotate the at least one rotatably mounted magnet (50; 50').

7. The measuring device of claim 1, wherein the magnetic field sensor (60) is arranged in a space (61) having a negative pressure or a positive pressure.

8. A system comprising two measuring devices of claim 1, wherein the two measuring devices are arranged on different sides of the cable (2), preferably on two opposing sides of the cable (2), and are each adapted to determine a measured value for an advancement of the cable (2) in relation to the relevant measuring device, wherein the advancement of the cable (2) in relation to the system is derived from the determined measured values, preferably by forming an average value from the determined measured values.

9. The measuring device of claim 1, wherein the cable is a push rod.

10. A method for measuring an advancement of a cable (2) of a sewer cleaning and/or sewer inspection system, wherein at least one measuring device (10) is used to measure the advancement of the cable (2), the measuring device comprising;
a compensation device (3) comprising:
at least one magnet (50; 50') mounted so as to be rotatable about an axis of rotation (DA; DA'), and
a magnet holder (40) for receiving the at least one rotatably mounted magnet (50; 50'), and
a magnetic field sensor (60),
wherein the at least one rotatably mounted magnet (50; 50') is arranged relative to the cable (2) in such a way that an advancement of the cable (2) causes the at least one rotatably mounted magnet (50; 50') to rotate,
wherein the magnetic field sensor (60) is stationarily arranged relative to the at least one rotatably mounted magnet (50; 50') in such a way that rotations of the at least one rotatably mounted magnet (50; 50') can be detected therewith, wherein the advancement of the cable (2) is determined from the detected rotations,
wherein radial movements of the cable (2) during advancement of the cable (2) are compensated by the at least one rotatably mounted magnet (50; 50') following the radial movements of the cable (2), such that the rotation of the at least one rotatably mounted magnet (50; 50') is produced even in the event of a radial movement of the cable (2) during advancement of the cable (2), and
wherein,
the cable (2) can be guided past the compensation device (30) while the cable (2) is being advanced,
the at least one rotatably mounted magnet (50; 50') is arranged on the magnet holder (40) in such a way that the advancement of the cable (2) can cause rotations of the at least one rotatably mounted magnet (50; 50') about the axis of rotation (DA, DA'), wherein the magnet holder (40) of the compensation device (30) is adapted to follow a movement of the cable (2) in the radial direction during advancement,
the magnetic field sensor (60) is stationarily arranged at a distance from the at least one rotatably mounted magnet (50; 50') and is adapted to detect the rotations of the at least one rotatably mounted magnet (50; 50'), wherein the detected rotations are a measure of the advancement of the cable (2), and
wherein the magnet holder (40) comprises a pivot arm (41), and the at least one rotatably mounted magnet (50) is arranged at a free end of the pivot arm (41) such that the at least one rotatably mounted magnet is pivotable relative to the magnetic field sensor.

11. The method of claim 10, wherein the cable is a push rod.

* * * * *